USO10545055B2

(12) United States Patent
Roig-Guitart et al.

(10) Patent No.: US 10,545,055 B2
(45) Date of Patent: Jan. 28, 2020

(54) ELECTRONIC DEVICE INCLUDING A TEMPERATURE SENSOR

(71) Applicant: SEMICONDUCTOR COMPONENTS INDUSTRIES, LLC, Phoenix, AZ (US)

(72) Inventors: Jaume Roig-Guitart, Oudenaarde (BE); Herbert De Vleeschouwer, Zulte (BE); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 310 days.

(21) Appl. No.: 15/621,093

(22) Filed: Jun. 13, 2017

(65) Prior Publication Data
US 2018/0356296 A1 Dec. 13, 2018

(51) Int. Cl.
| | |
|---|---|
| *G01K 7/00* | (2006.01) |
| *G01K 1/00* | (2006.01) |
| *G01K 7/20* | (2006.01) |
| *G01K 7/01* | (2006.01) |
| *H01L 29/08* | (2006.01) |
| *G01K 7/18* | (2006.01) |

(Continued)

(52) U.S. Cl.
CPC .................. *G01K 7/20* (2013.01); *G01K 7/01* (2013.01); *G01K 7/183* (2013.01); *H01L 29/0843* (2013.01); *H01L 29/41758* (2013.01); *H01L 29/4238* (2013.01); *H01L 29/78* (2013.01); *G01K 13/00* (2013.01)

(58) Field of Classification Search
USPC ......................................... 374/178, 163, 100
See application file for complete search history.

(56) References Cited

U.S. PATENT DOCUMENTS

| | | |
|---|---|---|
| 5,397,911 A | 3/1995 | Hiyama et al. |
| 9,461,158 B2 | 10/2016 | Fujii et al. |

(Continued)

FOREIGN PATENT DOCUMENTS

WO 2014199671 A1 12/2014

OTHER PUBLICATIONS

Arenas, Osvaldo et al. "Electrothermal Mapping of AlGaN/GaN HEMTs Using Microresistance Thermometer Detectors." IEEE Electron Device Letters, vol. 36, No. 2. Feb. 2015. pp. 111-113.

(Continued)

*Primary Examiner* — Mirellys Jagan
(74) *Attorney, Agent, or Firm* — Abel Schillinger, LLP

(57) ABSTRACT

An electronic device can include a temperature sensor. The temperature sensor can include a drain electrode including drain fingers spaced apart from the source fingers; a source electrode including source fingers spaced apart from the drain fingers; and a gate electrode including a runner, gate fingers and a conductive bridge. In an embodiment, the runner includes a first portion and a second portion spaced apart from the first portion, the gate fingers are coupled to the runner and each gate finger is disposed between a pair of the source and drain fingers. The conductive bridge connects at least two gate fingers, wherein the conductive bridge is along a conduction path between the first and second portions of the runner. Designs for the temperature sensor may provide a more accurate temperature measurement reflective of a transistor within the electronic device.

20 Claims, 8 Drawing Sheets

(51) Int. Cl.
  *H01L 29/78* (2006.01)
  *H01L 29/423* (2006.01)
  *H01L 29/417* (2006.01)
  *G01K 13/00* (2006.01)

(56) References Cited

U.S. PATENT DOCUMENTS

| | | |
|---|---|---|
| 2003/0210507 A1 | 11/2003 | Pihet et al. |
| 2005/0139891 A1 | 6/2005 | Beach et al. |
| 2006/0022218 A1 | 2/2006 | Masumoto et al. |
| 2009/0050900 A1 | 2/2009 | Masuda |
| 2010/0237437 A1 | 9/2010 | Takagi |
| 2011/0182324 A1 | 7/2011 | Stoisiek et al. |
| 2012/0217542 A1 | 8/2012 | Morita |
| 2013/0026485 A1 | 1/2013 | Hur et al. |
| 2013/0328060 A1 | 12/2013 | Liu et al. |
| 2014/0015019 A1 | 1/2014 | Okamoto et al. |

OTHER PUBLICATIONS

Arenas, Osvaldo et al. "Integration of Micro Resistance Thermometer Detectors in AlGaN/GaN Devices." Journal of the Electron Devices Society, Jun. 25, 2014. pp. 145-148.

Kwan, Alex Man Ho et al. "A Highly Linear Integrated Temperature Sensor on a GaN Smart Power IC Platform." IEEE Transactions on Electron Devices, vol. 61, No. 8, Aug. 2014. pp. 2970-2976.

Reiner, Richard et al. "Linear Temperature Sensors in High-Voltage GaN-HEMT Power Devices." In 2016 IEEE Applied Power Electronics Conference and Exposition (APEC), Mar. 2016. pp. 2083-2086.

Roberts, John et al. "Drive and Protection Methods for Very High Current Lateral GaN Power Transistors." In 2015 IEEE Applied Power Electronics Conference and Exposition (APEC), Mar. 2015. pp. 3128-3131.

Paine, Bruce M. et al. "Measurement of Temperature in GaN HEMTs by Gate End-to-End Resistance." IEEE Transactions on Electron Devices, vol. 63, No. 2, Feb. 2016. pp. 590-597.

ELECTRONIC DEVICE INCLUDING A TEMPERATURE SENSOR

FIELD OF THE DISCLOSURE

The present disclosure relates to electronic devices, and more particularly to, electronic devices that include temperature sensors.

RELATED ART

Temperature sensors can provide useful information used in controlling other electronic components. Some temperature sensors may be relatively simple and include a source electrode, a drain electrode, and a gate electrode. Such temperature sensors may not accurately simulate operating and temperature conditions within other electronic components. Further improvements in temperature sensors are desired.

BRIEF DESCRIPTION OF THE DRAWINGS

Embodiments are illustrated by way of example and are not limited in the accompanying figures.

Figure 1:
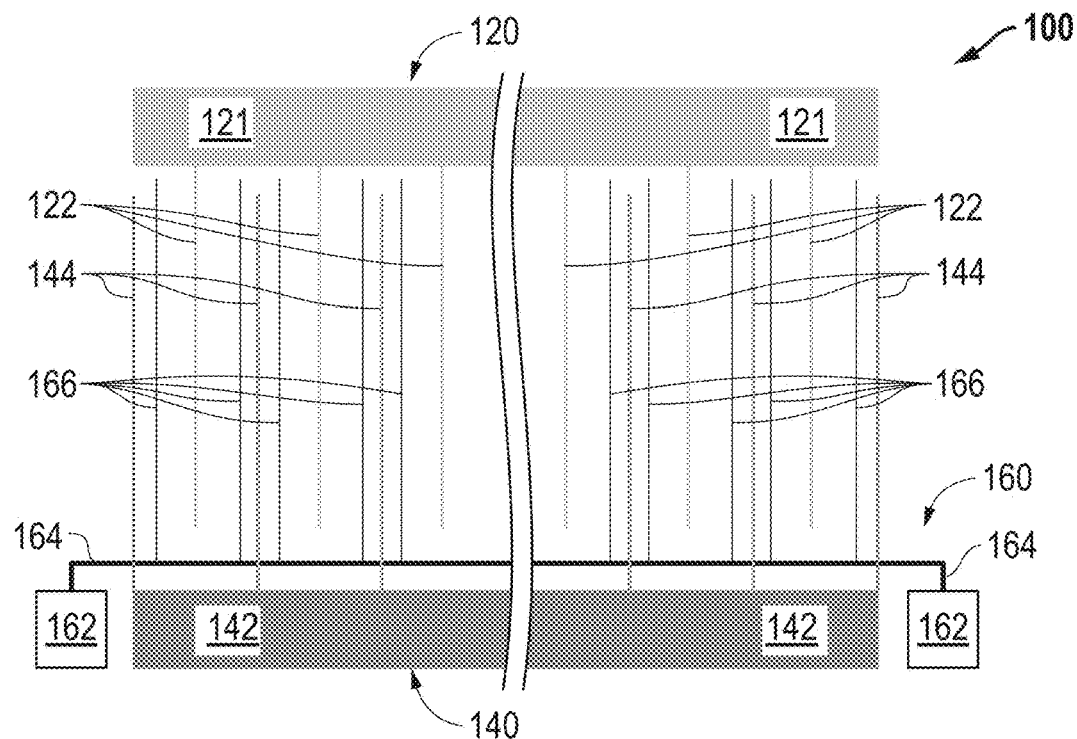
FIG. 1 includes an illustration of top view of a portion of an electronic device that includes operational transistor structures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers corresponding to columns within the Periodic Table of Elements based on the IUPAC Periodic Table of Elements, version dated Nov. 28, 2016.

The term "compound semiconductor" is intended to mean a semiconductor material that includes at least two different elements. Examples include SiC, SiGe, GaN, InP, $Al_{v}Ga_{(1-v)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "high voltage," with reference to a layer, a structure, or a device, means that such layer, structure, or device can withstand at least 50 V difference across such layer, structure, or device (e.g., between a source and a drain of a transistor when in an off-state) without exhibiting dielectric breakdown, avalanche breakdown, or the like.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "operational transistor" is intended to mean a transistor that is intended to principally function as a switch in controlling when current does and does not flow through between a source/emitter and a drain/collector. The term "operational transistor structure" is intended to mean a transistor structure that is intended to principally function as (1) a switch in controlling when current does and does not flow through between a source/emitter terminal and a drain/collector terminal or (2) a capacitor when source/emitter and drain/collector regions are electrically connected to each other. A temperature sensor is not an operational transistor because its principal function is to provide a temperature measurement, not to flow current between source/emitter and drain/collector terminals of the temperature sensor.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a temperature sensor. In an embodiment, the electronic device can further include an operational transistor with operational transistor structures that may operate at a temperature significantly higher than room temperature (approximately 25° C.). The design of the temperature sensor can correspond more closely to the design of the operational transistor structures that carry most, if not all, of the current for the electronic device. Thus, the temperature sensor may provide a more accurate temperature that is reflective of the operational transistor structures. Although the description below is addressed to an electronic device in which the operational transistor and temperature sensor are on the same die, in another embodiment, the temperature sensor may be on a different die. In yet another embodiment, the electronic device can be a standalone temperature sensor.

Many different designs can be used with the temperature sensor that vary from relatively simpler to relatively more complicated. The designs can allow for a wide range of resistances to be achieved. The temperature sensor can have a linear relationship between resistance and temperature.

The temperature sensor can include a drain electrode including drain fingers; a source electrode including source fingers spaced apart from the drain fingers; and a gate electrode including a runner, gate fingers and a conductive bridge. In an embodiment, the runner includes a first portion and a second portion spaced apart from the first portion, the gate fingers are coupled to the runner and each gate finger is disposed between a pair of the source and drain fingers. The conductive bridge can connect at least two gate fingers, wherein the conductive bridge is along a conduction path between the first and second portions of the runner.

The electronic device, including the temperature sensor, and its alternative designs are described in more detail below. After reading the specification, skilled artisans will have a better understanding of the options available in designing the temperature sensor. The embodiments described below are illustrative and not limiting to the present invention, which is defined in the appended claims.

Figure 2:
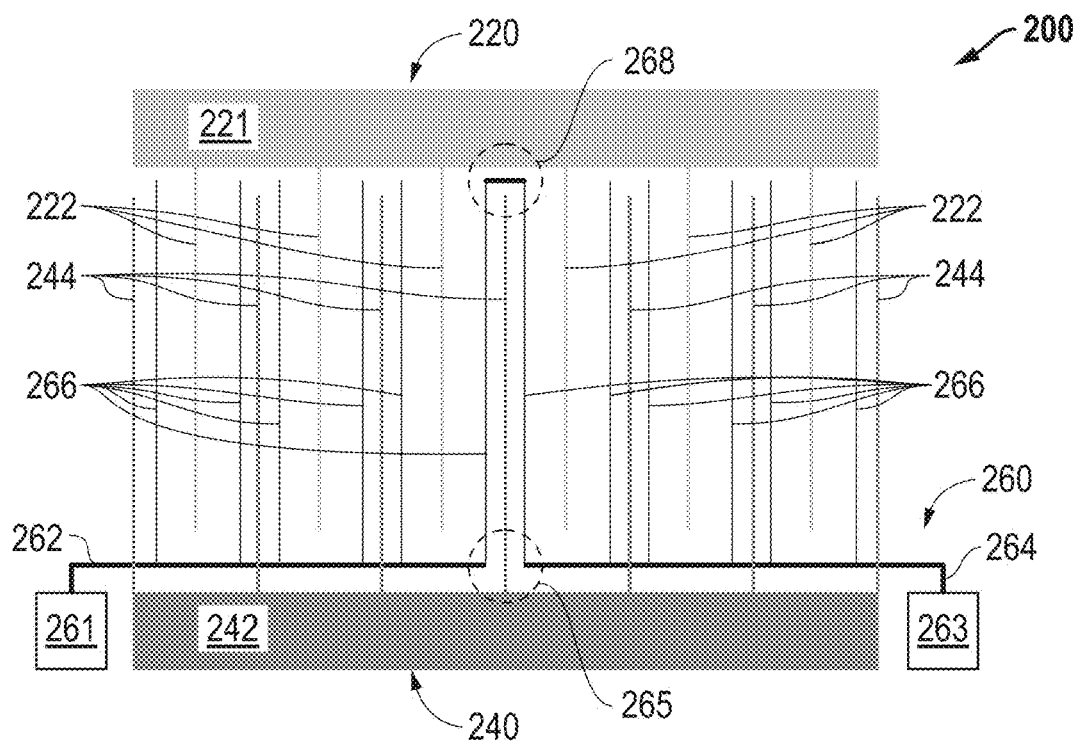
FIG. 2 includes an illustration of top view of another portion of the electronic device of FIG. 1 where the other portion includes a temperature sensor in accordance with an embodiment described herein.

FIGS. 1 and 2 include top views of different portions of an electronic device. FIG. 1 includes operational transistor structures that are used for controlling current flowing through the electronic device. FIG. 2 includes a temperature sensor. As can be seen when comparing FIGS. 1 and 2, the physical designs of the drain and source electrodes are nearly the same between the operational transistor structures and the temperature sensor, with the number of source fingers and drain fingers being different. However, the physical designs of the gate electrodes are significantly different between the operational transistor structures and the temperature sensor. In particular, the operational transistor structures can have a continuous gate runner without any breaks, and the temperature sensor can have a gate runner with one or more gaps, as will be described in more detail below.

FIG. 1 includes a top view of portions of the operational transistor structures that allow for substantially all of the current to flow for the operational transistor 100 that is made up of the operational transistor structures. The physical design of the transistor 100 has interdigitated source, drain, and gate fingers. A drain electrode 120 can include a drain interconnect 121 that can contact and be electrically connected to a subsequently-formed drain terminal. At their proximal ends, drain fingers 122 extend from the drain interconnect 121 and terminate at their distal ends opposite the proximal ends. A source electrode 140 can include a source interconnect 142 that can contact and be electrically connected to a subsequently-formed source terminal. At their proximal ends, source fingers 144 extend from the source interconnect 142 and terminate at their distal ends opposite the proximal ends.

A gate electrode 160 can include gate interconnects 162 that can contact and be electrically connected to a subsequently-formed gate terminal. The gate electrode 160 further includes a gate runner 164 and gate fingers 166. At their proximal ends, gate fingers 166 extend from the gate runner 164 and terminate at their distal ends opposite the proximal ends. The gate runner 164 can be continuous without any gaps along the gate runner 164. The gate runner 164 can have a substantially lower resistance as compared to the gate fingers 166. Thus, the gate runner 164 allows for a relatively low resistance connection between the gate fingers 166 and the gate pads 162. After reading this specification, skilled artisans will appreciate that the transistor 100 may have hundreds or thousands of transistor structures along the row with the transistor structures illustrated in FIG. 1.

Referring to FIG. 2, a temperature sensor 200 has a structure that is similar to the transistor 100. The similarity in the physical design can allow for temperature measurements using the temperature sensor 200 to correspond more closely to temperatures that would be seen in the transistor 100.

A drain electrode 220 can include a drain interconnect 221 that can contact and be electrically connected to a subsequently-formed drain terminal. At their proximal ends, drain fingers 222 extend from the drain interconnect 221 and terminate at their distal ends opposite the proximal ends. A source electrode 240 can include a source interconnect 242 that can contact and be electrically connected to a subsequently-formed source terminal. At their proximal ends, source fingers 244 extend from the source interconnect 242 and terminate at their distal ends opposite the proximal ends.

In some respects, a gate electrode 260 of the temperature sensor 200 is similar to the gate electrode 160 of the transistor 100. The gate electrode 260 also includes gate fingers 266. At their proximal ends, gate fingers 266 extend from portions 262 and 264 of the gate runner and terminate at their distal ends opposite the proximal ends. The gate electrode 260 can include a gate pad 261 and a sensor pad 263. The gate pad 261 and the sensor pad 263 can contact and be electrically connected to subsequently-formed pads, respectively, for the temperature sensor. The gate electrode 260 further includes a gate runner having a portion 262 electrically connected to the gate pad 261 and a portion 264 electrically connected to the sensor pad 263.

Unlike the gate runner 164, the gate runner of the temperature sensor 200 is not continuous. The portions 262 and 264 of the gate runner are separated by a gap 265. A conductive bridge 268 connects two different gate fingers 266 near the center of the temperature sensor 200. In the embodiment as illustrated, one of the source fingers 244 near the center is surrounded on three sides by the combination of the conductive bridge 268 and its immediately adjacent gate fingers 266. Such combination is spaced apart from the outer portions of the temperature sensor 200. By using the gap 265 and the conductive bridge 268, the resistance between the gate and sensor pads 261 and 263 is significantly greater than the same physical design except where the gate runner is continuous, similar to the gate runner 164 in FIG. 1.

Figure 3:
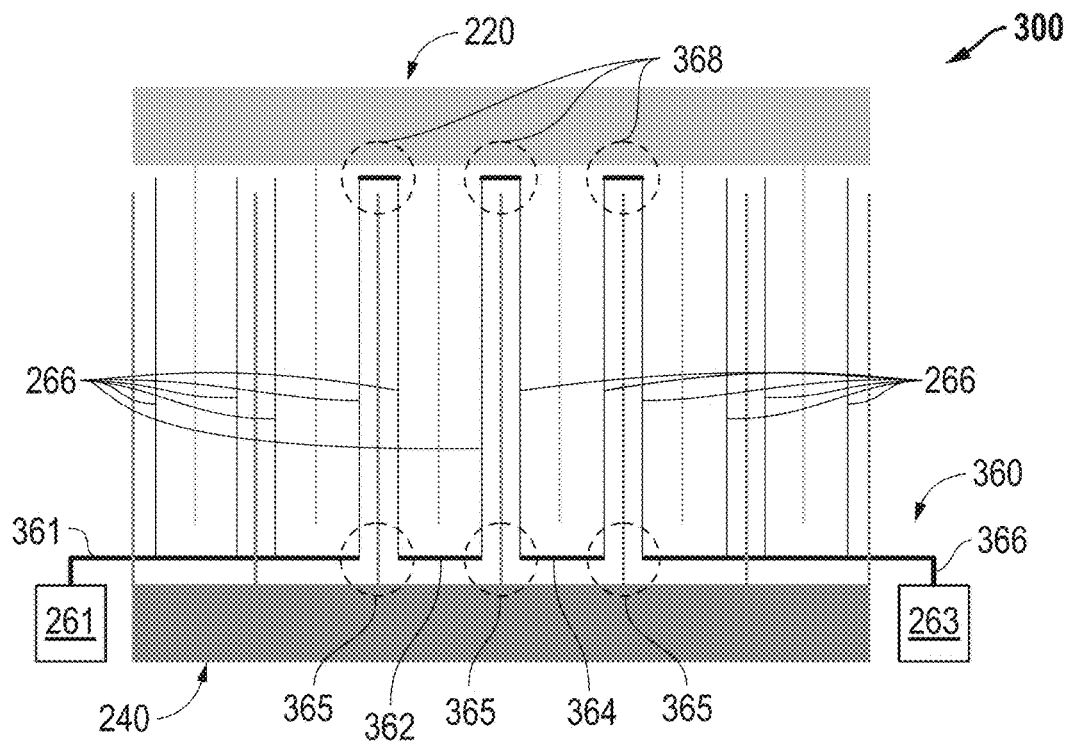
FIG. 3 includes an illustration of top view of another portion of the electronic device of FIG. 1 where the other portion includes a temperature sensor in accordance with another embodiment described herein.

Other physical designs can be used to allow more flexibility in achieving different resistances between the gate and sensor pads 261 and 263. FIG. 3 includes a top view of a temperature sensor 300. The drain electrode 220 and the source electrode 240 for the temperature sensor 300 are the same as previously described with respect to FIG. 2. A gate electrode 360 of the temperature sensor 300 has more gaps 365 and conductive bridges 368 as compared to the gate electrode 260 in FIG. 2. The gate electrode 360 can include a gate runner with portions 361, 362, 364, and 366. The additional gaps 365 and conductive bridges 368 can allow for a higher resistance between the gate and sensor pads 261 and 263, as compared to the gate electrode 260 in FIG. 2.

Figure 4:
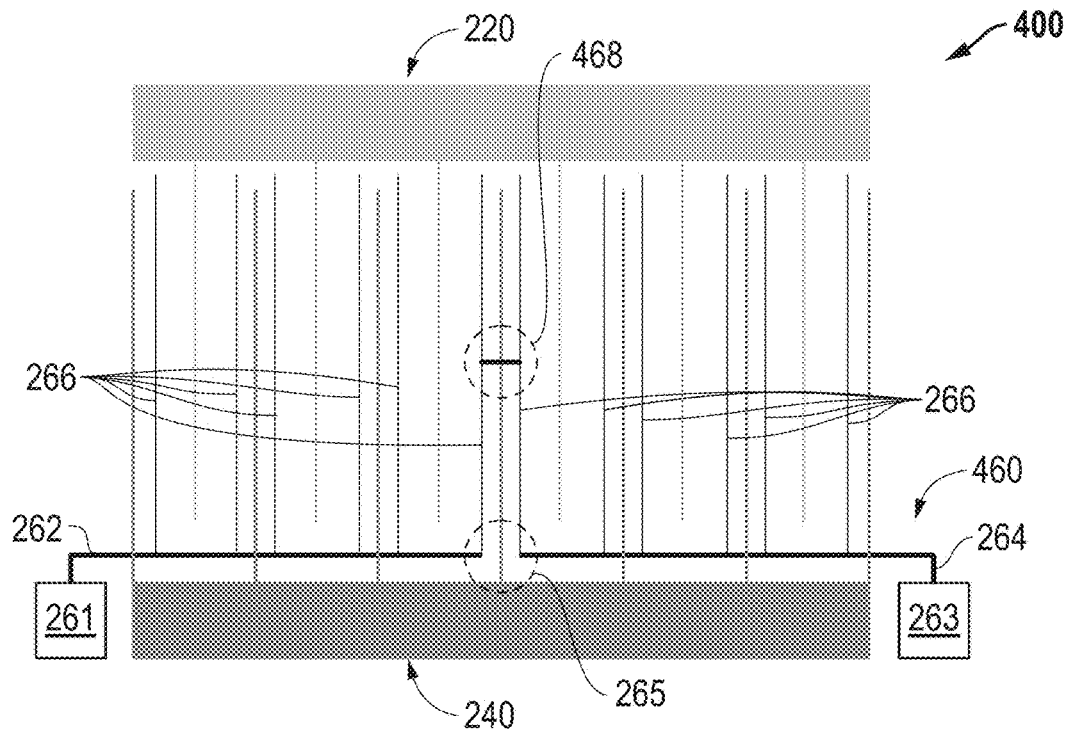
FIG. 4 includes an illustration of top view of another portion of the electronic device of FIG. 1 where the other portion includes a temperature sensor in accordance with a further embodiment described herein.

FIG. 4 includes a top view of a temperature sensor 400. A gate electrode 460 of the temperature sensor 400 is similar to the gate electrode 260. The gate electrode 460 can include a conductive bridge 468 connected to gate fingers 266 at locations between the distal and proximal ends of such gate fingers 266. Such a configuration can allow for a lower resistance between the gate and sensor pads 261 and 263, as compared to the gate electrode 260 in FIG. 2 but still higher than if the gate runner would have been continuous without any gap, such as gate runner 164 in FIG. 1.

Figure 5:
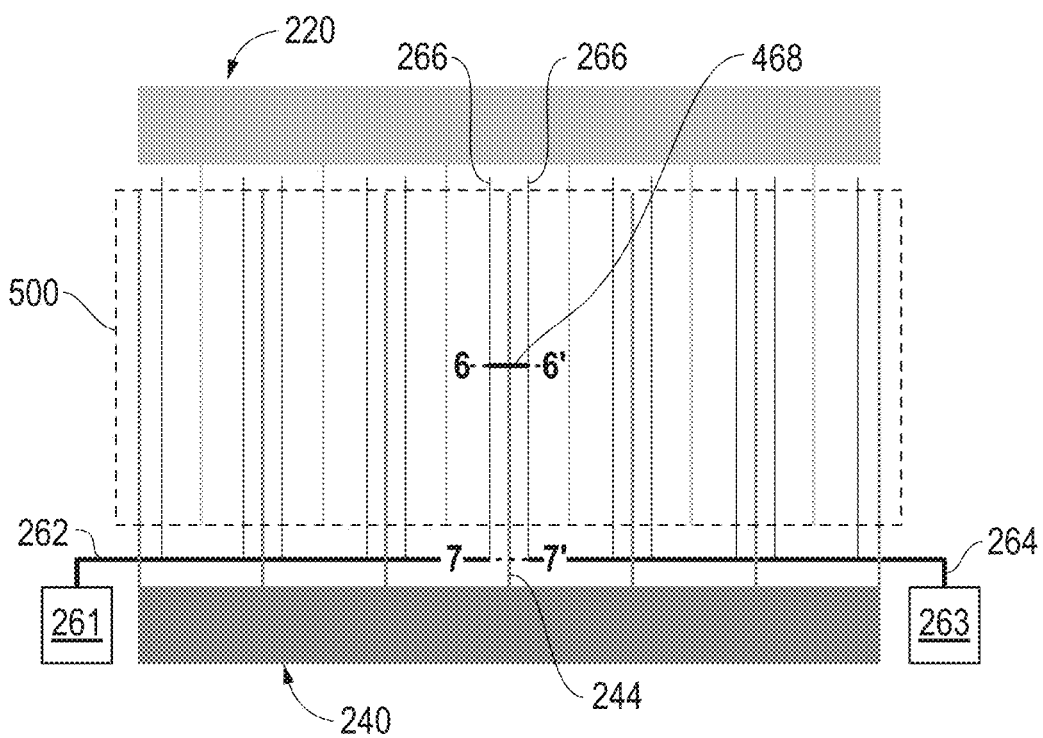
FIG. 5 includes the illustration of FIG. 4 further including sectioning lines 6-6' and 7-7'.
Figure 6:
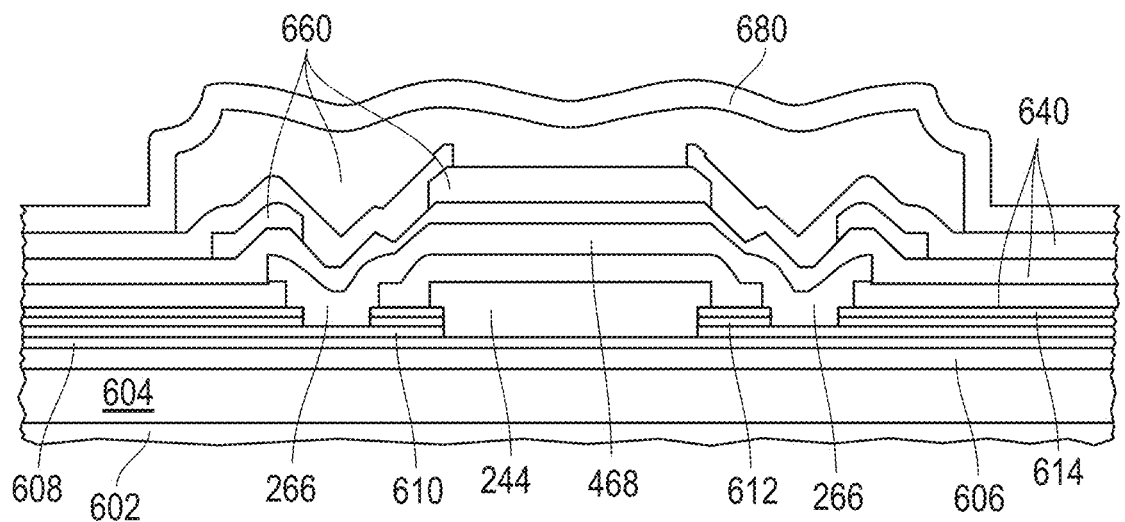
FIGS. 6 and 7 includes illustrations of cross-sectional views of portions of the temperature sensor corresponding to sectioning lines 6-6' and 7-7', respectively, of FIG. 5.

FIG. 5 includes a top view of the temperature sensor 400 and the active region 500 of the temperature sensor 400. FIG. 5 further includes sectioning lines 6-6' and 7-7'. FIG. 6 includes a cross-sectional view of the temperature sensor 400 along sectioning line 6-6' in FIG. 5 after forming additional interlevel dielectric (ILD) layers and interconnect levels, and FIG. 7 includes a cross-sectional view of the temperature sensor 400 along sectioning line 7-7' in FIG. 5 after forming additional ILD layers and interconnect levels. Thus, the top view in FIG. 5 is a depiction after the interconnect level with the gate fingers 266 and conductive bridge 468 is formed and before forming subsequent ILD layers and interconnect levels.

Figure 7:
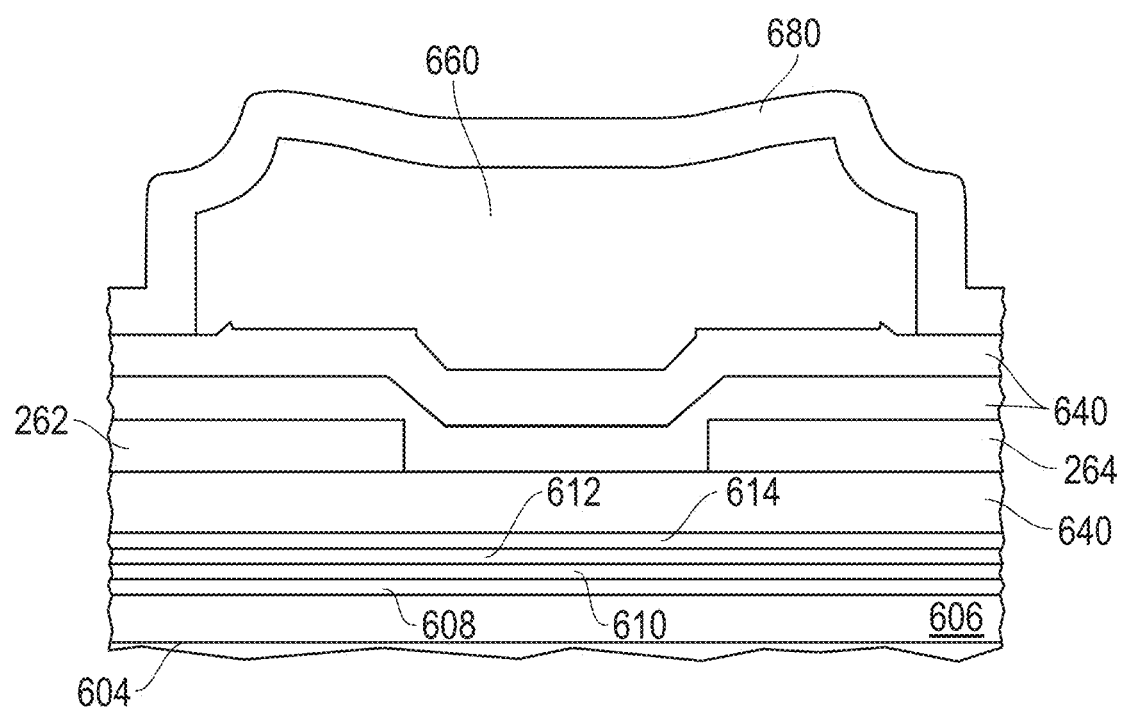

A process for forming the electronic device including the operational transistor structures and the temperature sensor 400 are described in reference to FIGS. 5 to 7. The workpiece includes a substrate 602, a buffer layer 604, a channel layer 606, a barrier layer 608, a gate dielectric layer 610, an intermediate layer 612, and a capping layer 614. The substrate 602 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The buffer layer 604 can form formed over the substrate 602 to help with supporting a high voltage and to provide a template for the channel layer 606. The buffer layer 604 can have a thickness in a range of approximately 1 micron to 10 microns. The channel layer 606 is formed over the buffer layer 604 and the substrate 602. The channel layer 606 can include a monocrystalline compound semiconductor material. In an embodiment, the channel layer 606 can include a Group 13-N material, such as $Al_aGa_{(1-a)}N$, wherein $0 \le a \le 0.1$. In a particular embodiment, the channel layer 606 includes GaN (in the prior formula, a=0). In another embodiment, another semiconductor material, such a as Group 14 semiconductor material (Si, Ge, etc.) or a compound semiconductor material (e.g., SiC, III-V material, or II-VI material) may be used. The channel layer 606 may have a thickness in a range of 10 nm to 200 nm. The barrier layer 608 can include $Al_dGa_{(1-d)}N$, wherein $0.15 \le d \le 0.35$. The barrier layer 608 can have a thickness in a range of 10 nm to 40 nm. The layers 606 and 608 can be formed using an epitaxial growth technique, and thus the layers 606 and 608, and at least a portion of the buffer layer 604 can be monocrystalline.

The gate dielectric layer 610, the intermediate layer 612, and the capping layer 614 can be serially formed over the barrier layer 608, the channel layer 606, the buffer layer 604, and the substrate 602. In an embodiment, the gate dielectric layer 610 can include a silicon nitride, an aluminum oxide, a zirconium oxide, a hafnium oxide, a niobium oxide, another suitable gate dielectric material, or any combination thereof and have a thickness in a range of 5 nm to 40 nm. The intermediate layer 612 can act as an etch-stop layer when etching the capping layer 614. In an embodiment, the intermediate layer 612 can include AN and have a thickness in a range of 2 nm to 20 nm. The capping layer 614 can protect the gate dielectric layer 610. In an embodiment, the capping layer 614 can include silicon nitride and have a thickness in a range of 20 nm to 500 nm. After reading this specification, skilled artisans will appreciate that not all of the previously described layers are required and that other layers may be used in place of or in conjunction with the previously described layers.

Contact openings may be formed at locations where the drain fingers 222 of the temperature sensor 400, transistor drain fingers 122 of the transistor structures (FIG. 1), the source fingers 244 of the temperature sensor 400, transistor source fingers 144 of the transistor structures are to be formed. The openings can extend to the barrier layer 608. A conductive layer is deposited over the workpiece. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer is patterned to form the drain fingers 222, the transistor drain fingers 122, the source fingers 244, and the transistor source fingers 144. The drain interconnect 221, the transistor drain interconnect 121 (FIG. 1), the source interconnect 242, and the transistor source interconnect 142 can be formed at the same interconnect level as the fingers or may be formed at another interconnect level.

One of the ILD layers 640 can be formed over the workpiece, and contact openings may be formed at locations where the gate fingers 266 of the temperature sensor 400 and transistor gate fingers 166 of the transistor structures (FIG. 1) are to be formed. The openings can initially extend to the intermediate layer 612 and then the etch chemistry can be changed to further extend the openings through the intermediate layer 612 to expose the gate dielectric layer 610. A conductive layer is deposited over the workpiece. At the gate interconnect level, the conductive layer can have a composition selected to provide a proper work function for the transistor being formed. The conductive layer can include Ti, TiN, Al, Pd, Pt, W, Au, Ni, or a stack or any combination thereof. In another embodiment, the conductive layer is typically at least 50 wt % aluminum, copper, a noble metal, or an alloy of any of the foregoing. The conductive layer is patterned to form the gate fingers 266, the transistor gate fingers 166, the portions 262 and 264 of the gate runner of the temperature sensor 400, and the transistor gate runner 164 (FIG. 1). The pads 261 and 263 and the transistor gate pads 162 (FIG. 1) can be formed at the gate interconnect level or may be formed at another interconnect level.

As previously described, FIG. 5 illustrates the physical design after the gate interconnect level is formed. As illustrated in FIG. 6, the conductive bridge 468 is formed at the gate interconnect level, passes over the source finger 244 and is separated from the source finger 244 by one of the ILD layer 640. As illustrated in FIG. 7, portions 262 and 264 of the gate runner extend from the gate fingers 266 to edges of the drawing. Unlike FIG. 6, a gap 265 (see FIG. 4) lies between the portions 262 and 264 of the gate runner, and thus, a conductive bridge is not seen in FIG. 7.

Processing is continued to form a substantially completed device. One or more additional ILD layers 640, levels of interconnects including interconnects 660, and a passivation layer 680 can be formed if needed or desired. The interconnects 660 illustrated in FIG. 6 can be electrically connected to the source electrode 240 and a source terminal. Portions of the interconnects 660 extending beyond the gate fingers 244 can help with shielding.

Figure 8:
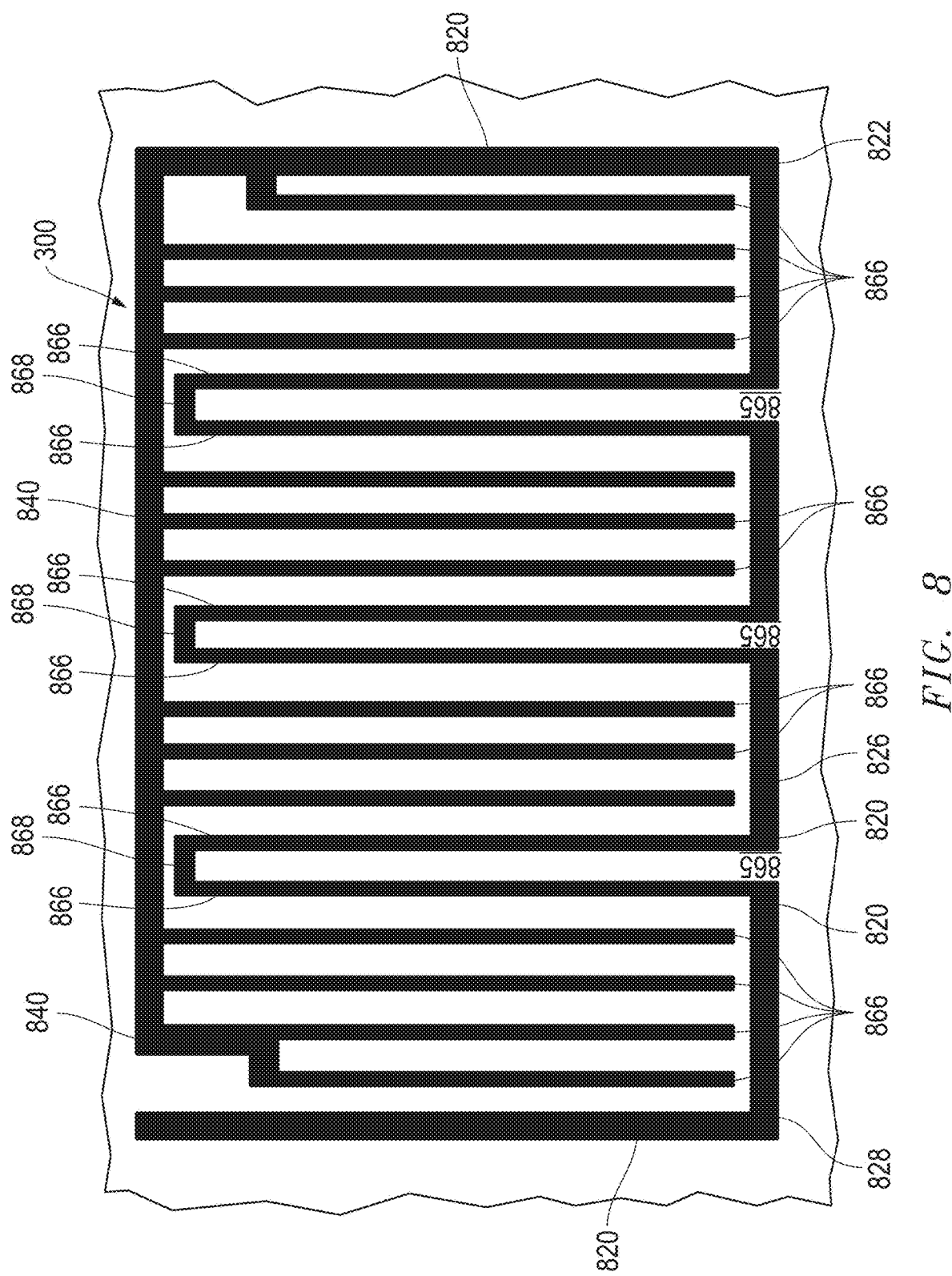
FIG. 8 includes an illustration of a top view of a mask for a gate electrode layer of a temperature sensor according to yet another embodiment described herein.

The physical design may be more complicated than previously illustrated and described. FIGS. 8 to 11 include top views of a temperature sensor in accordance with an alternative embodiment. FIG. 8 includes a top view of a pattern for a gate electrode layer 800 for the temperature sensor. Other patterns are not illustrated with the pattern for the gate electrode layer to simplify understanding of features within the pattern. A gate pad (not illustrated in FIG. 8) will be subsequently formed within the upper right-hand corner of the gate electrode layer 800, and a sensor pad (not illustrated in FIG. 8) will be subsequently formed at the upper left-hand side of the gate electrode layer 800. The gate electrode layer 800 includes gate runners 820 and 840 and gate fingers 866 extending from the gate runners 820 and 840. The gate runner 820 is along the conduction path between the areas that the subsequently-formed gate and sensor pads. The gate runner 820 includes portions 822, 824, 826, and 828 and gaps 865 between the portions 822, 824, 826, and 828. Conductive bridges 868 are connected to gate fingers 866 to complete the electrically connections between the subsequently-formed gate and sensor pads. The gate runner 840 provides gate signals to the gate fingers 866. Unlike the gate runner 820, the end of the runner 840 opposite the gate pad will not be electrically connected to the sensor pad.

Figure 9:
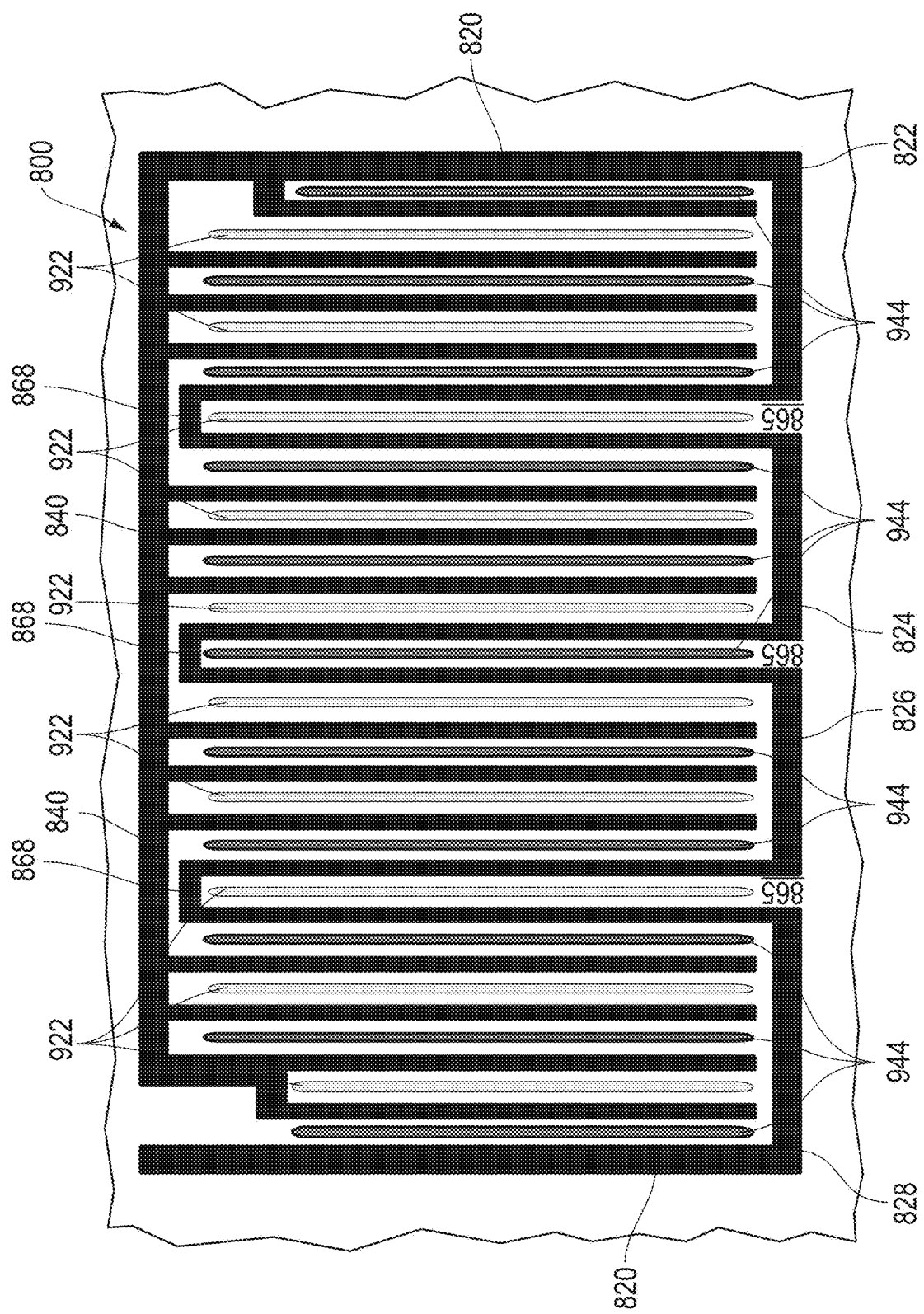
FIG. 9 includes an illustration of a top view of the gate electrode layer of FIG. 8 after forming drain fingers, source fingers and the gate electrode layer.

FIG. 9 includes a top view of a workpiece after forming drain fingers 922 source fingers 944, and the gate electrode layer 800. Before forming the gate electrode layer 800, an ILD layer is deposited and patterned to define openings for drain finger 922 and source finger 944. The openings extend to the barrier layer 608 (FIG. 6). A conductive layer is deposited and patterned to form the drain and source fingers 922 and 944. Another ILD layer is deposited and patterned to define openings for gate electrode layer 800. The openings extend to the gate dielectric layer 610 (FIG. 6). A conductive layer is deposited and patterned to form the gate electrode layer 800. Thus, FIG. 9 illustrates the relative positions of the drain and source fingers 922 and 944 relative to the gate electrode layer 800.

Figure 10:
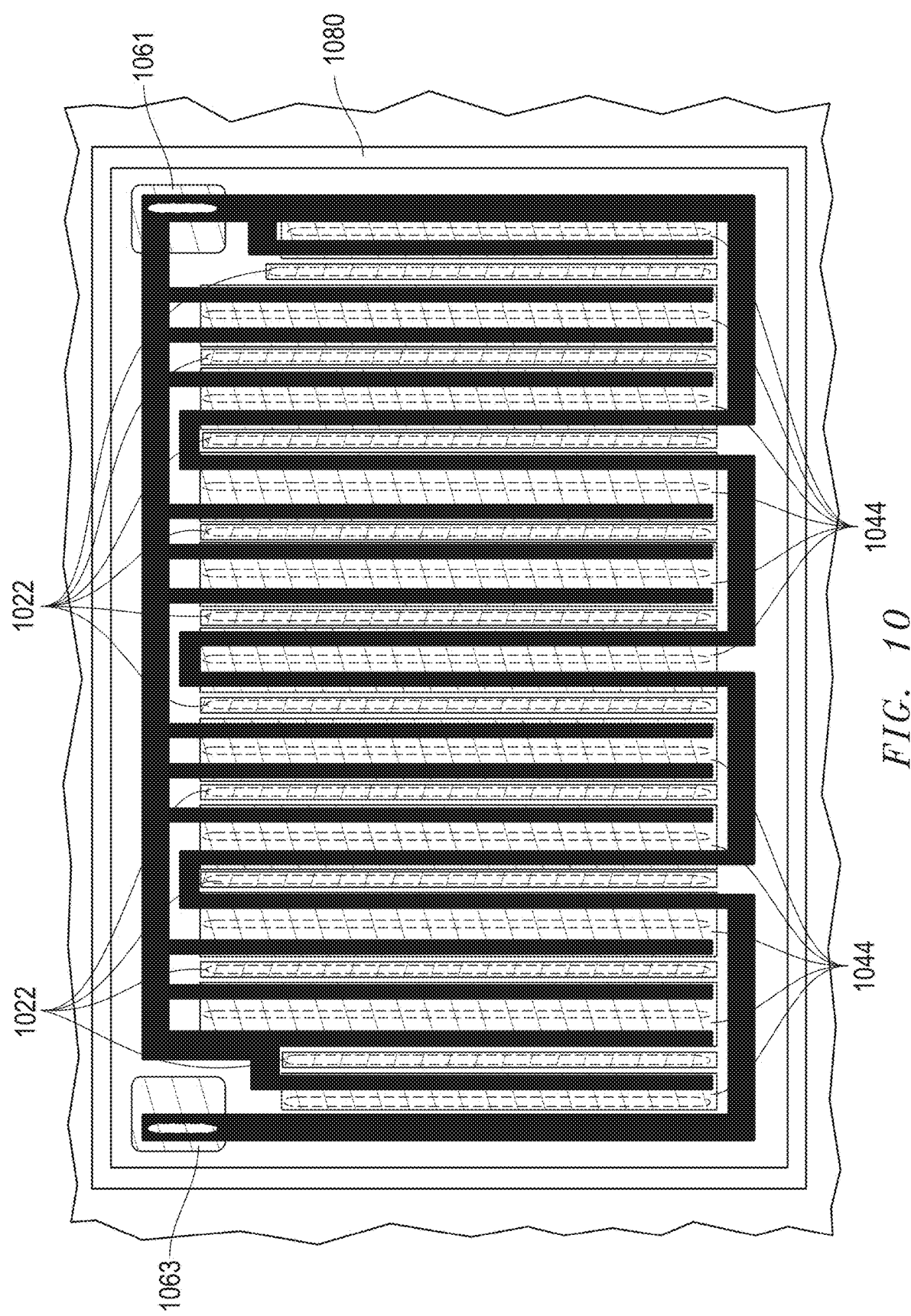
FIG. 10 includes an illustration of a top view of the gate electrode layer of FIG. 9 after forming drain electrodes, source electrodes, gate and sensor pads, and a guard ring.

One or more pairs of a patterned ILD layer and a patterned conductive layer are formed. After such processing, drain electrodes 1022, source electrodes 1044, a gate pad 1061, a sensor pad 1063, and a guard ring 1080 are formed, as illustrated in FIG. 10. Dashed lines within the drain electrodes 1022 correspond to openings to the drain fingers 922, and dashed lines within the source electrodes 1044 correspond to openings to the source fingers 944. The guard ring 1080 can be connected to the drain or the source of the operational transistor. The features in FIG. 10 may be formed at the same or different interconnect levels as compared to one another. For example, the drain and source electrodes 1022 and 1044 and the guard ring 1080 can be formed before or after the gate electrode layer 800.

Figure 11:
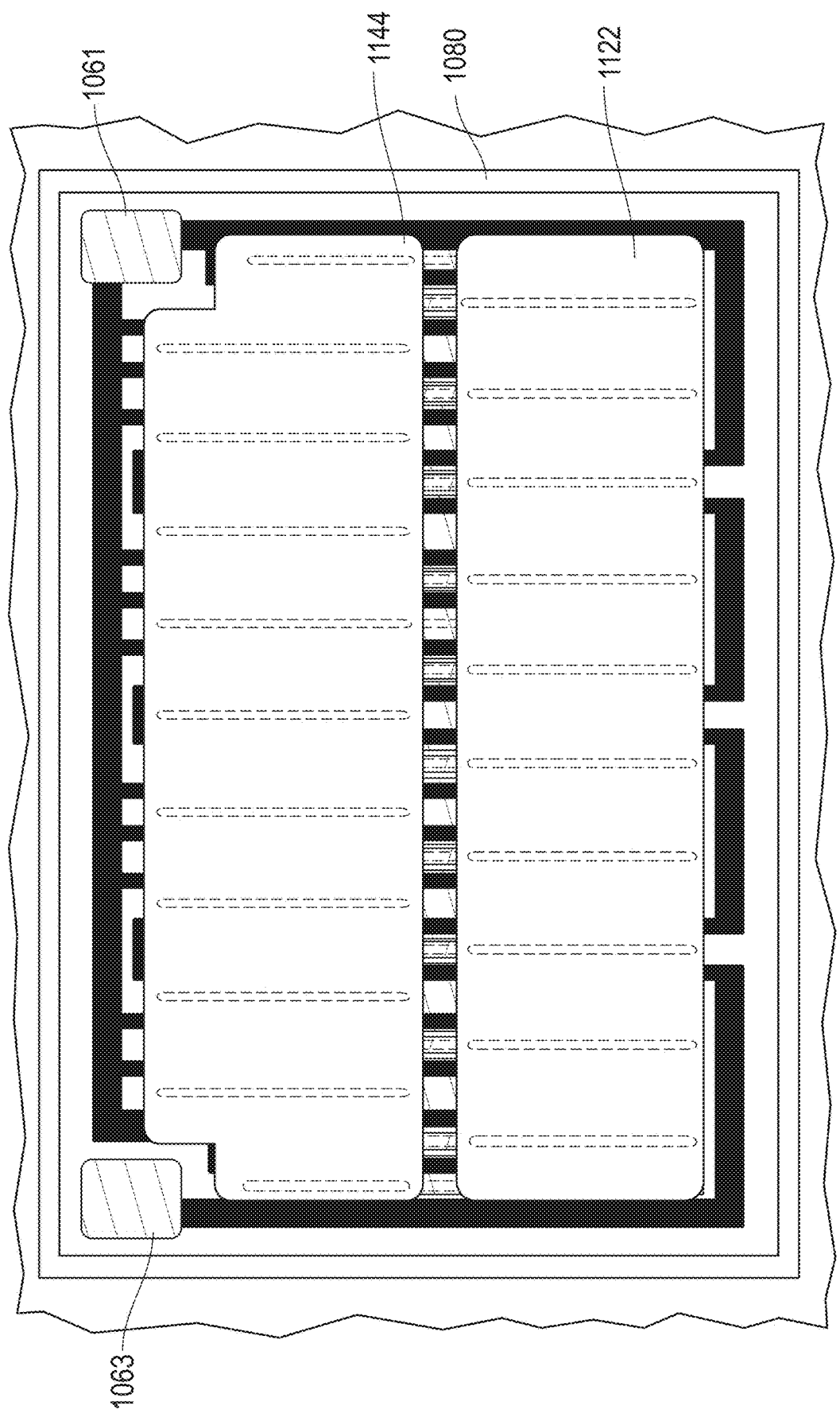
FIG. 11 includes an illustration of a top view of the temperature sensor of FIG. 10 after forming a drain terminal and a source terminal.

Another ILD layer can be formed and patterned to provide openings to the drain electrodes 1022 and the source electrodes 1044. A conductive layer is deposited and patterned to form a drain terminal 1122 and a source terminal 1144, as illustrated in FIG. 11. The drain terminal 1122 is electrically connected to the drain electrodes 1022 within the dashed lines, and the source terminal 1144 is electrically connected to the source electrodes 1044 within the dashed lines. Wires, clips or the like (not illustrated) can be attached to the drain terminal 1122, the source terminal 1144, the gate pad 1061, the sensor pad 1063, and the guard ring 1080.

Figure 12:
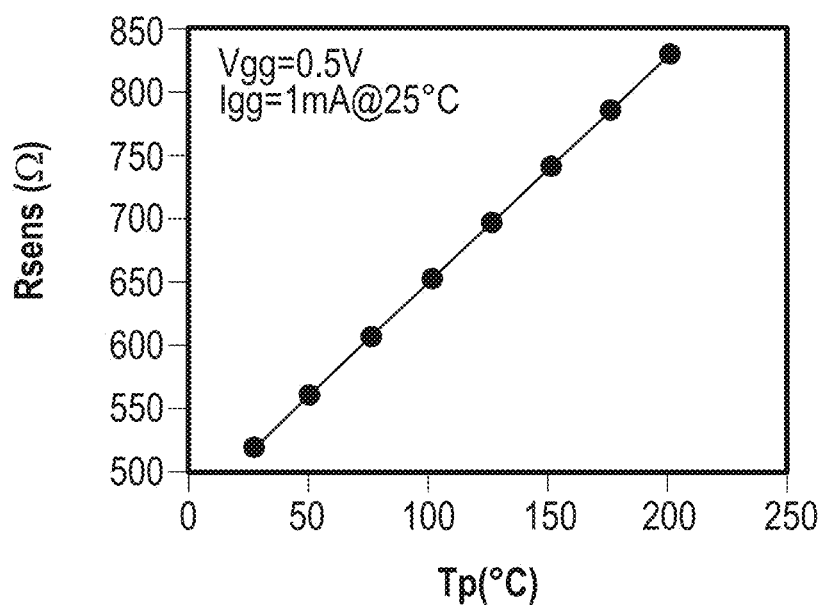
FIG. 12 includes a plot of resistance as a function of temperature for the temperature sensor in accordance with the design as illustrated in FIG. 2

Embodiments provide benefits over conventional designs of temperature sensors. The sensors are incorporated into a layout that closely replicates the operational transistor structures. Thus, the temperature as sensed by the temperature sensor can correspond more closely to the temperature of the operational transistor structures. The sensor is designed such that some current can flow between the source and drain fingers and under the gate fingers of the temperature sensor. The temperature sensor can have a linear relationship between temperature and resistance. FIG. 12 includes a plot of resistance as a function of temperature for the temperature sensor 200 embodiment of FIG. 2 when the gate pad 261 is at 0.5 V and the current is 1 mA at 25° C. The temperature sensor 200 is well suited for operating in a range of 25° C. to 200° C.

The temperature sensor can be formed using design rules for the operational transistor structures. The gate mask can be changed to achieve the desired resistance. Embodiments as described herein can have resistances higher than gate electrode with a gate runner without any gap. The resistance between the gate and sensor pads can be 1.1 to 900 or more times higher than a gate runner without any gap. The gate electrode 260 in FIG. 2 may have a resistance 5 to 15 times higher than a gate electrode having a runner without any gap. The gate electrode 360 in FIG. 3 may have a resistance 20 to 50 times higher than a gate electrode having a runner without any gap. The gate electrode 460 in FIG. 4 may have a resistance 1.1 to 5 times higher than a gate electrode having a runner without any gap. Thus, a designer has great flexibility in achieving a wide variety of resistances depending on the needs or desires for a particular application.

No additional masks or process steps are required to form the embodiments as described herein. A relatively simple gate mask change can be made to achieve a desired resistance.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device including a temperature sensor, the temperature sensor including:
a drain electrode including drain fingers;
a source electrode including source fingers spaced apart from the drain fingers;
a gate electrode including a runner, gate fingers, and a first conductive bridge, wherein:
 the runner includes a first portion and a second portion spaced apart from the first portion;
 the gate fingers are coupled to the runner and each gate finger is disposed between a pair of the source and drain fingers; and
 the first conductive bridge connects at least two gate fingers, wherein the first conductive bridge is along a conduction path between the first and second portions of the runner.

Embodiment 2. The electronic device of Embodiment 1, wherein the gate fingers have proximal ends extending from the runner and distal ends opposite the proximal ends.

Embodiment 3. The electronic device of Embodiment 2, wherein the first conductive bridge is at the distal ends of the at least two gate fingers, wherein from a top view, a combination of the first conductive bridge and at least two gate fingers lie along three sides of a particular source finger of the source electrode.

Embodiment 4. The electronic device of Embodiment 2, wherein the first conductive bridge is spaced apart from the distal ends and the proximal ends of the at least two gate fingers, wherein the first conductive bridge overlies a particular source finger of the source electrode.

Embodiment 5. The electronic device of Embodiment 1, further including a transistor including:
a transistor source electrode including transistor source fingers;
a transistor drain electrode including transistor drain fingers spaced apart from the transistor source fingers; and
a transistor gate electrode including transistor gate fingers, wherein the transistor gate fingers are disposed between the transistor source and transistor drain fingers.

Embodiment 6. The electronic device of Embodiment 1, wherein the temperature sensor further includes a gate pad and a sensor pad, wherein the gate pad is coupled to the runner, wherein along the conduction path, the gate pad is closer to first portion of the runner than to the second portion of the runner; and the sensor pad is coupled to the runner, wherein along the conduction path, the sensor pad is closer to second portion of the runner than to the first portion of the runner.

Embodiment 7. The electronic device of Embodiment 6, wherein the runner makes up at most 30% of the resistance between the gate and sensor pads.

Embodiment 8. The electronic device of Embodiment 6, wherein the gate electrode further includes a second conductive bridge, wherein the runner includes a third portion, wherein the third portion of the runner is disposed between the first and second portions of the runner; and the second conductive bridge electrically connects at least two different gate fingers at a second bridge region spaced apart from the first, second and third portions of the runner, wherein the second conductive bridge is along the conduction path between the second and third portions of the runner.

Embodiment 9. The electronic device of Embodiment 8, wherein along the conduction path, the sensor pad that is closer to second portion of the runner than to each of the first and third portions of the runner.

Embodiment 10. The electronic device of Embodiment 6, further including a source terminal coupled to the source electrode, and a drain terminal coupled to the drain electrode.

Embodiment 11. The electronic device of Embodiment 1, further including a channel layer including a Group 13-N material.

Embodiment 12. The electronic device of Embodiment 11, wherein the temperature sensor further includes a source terminal, a drain terminal, a gate pad, and a sensor pad, wherein:
the source terminal is coupled to the source electrode;
the drain terminal is coupled to the drain electrode;
the gate fingers have proximal ends extending from the runner and distal ends opposite the proximal ends;
the gate pad is coupled to the runner, wherein along the conduction path, the gate pad is closer to first portion of the runner than to the second portion of the runner;
the sensor pad is coupled to the runner, wherein along the conduction path, the sensor pad is closer to second portion of the runner than to the first portion of the runner; and
the runner makes up at most 30% of the resistance between the gate and sensor pads.

Embodiment 13. An electronic device including a temperature sensor, the temperature sensor including:
a source electrode including source fingers;
a drain electrode spaced apart from the source fingers;
a gate electrode including a first runner, a first set of gate fingers coupled to the first runner, a second runner, and a second set of gate fingers coupled to the second runner, wherein:
 the first runner includes a first portion and a second portion spaced apart from the first portion;
 a first conductive bridge that electrically connects at least to gate fingers at a location spaced apart from the first and second portions of the first runner, such that the first conductive bridge is along a conduction path between the first and second portions of the first runner.

Embodiment 14. The electronic device of Embodiment 13, further including a gate pad and a sensor pad coupled to the gate electrode, wherein the first runner lies along a conduction path between the gate and sensor pads, and the second runner does not lie along a conduction path between the gate and sensor pads.

Embodiment 15. The electronic device of Embodiment 13, wherein the gate fingers within the second set of gate fingers are connected to each other only along the second runner.

Embodiment 16. The electronic device of Embodiment 13, wherein each of the gate fingers within the first and second set of gate fingers includes a proximal end and a distal end opposite the proximal end; proximal ends of the gate fingers within the first set of gate fingers extend from the first runner near a first side of the temperature sensor; and proximal ends of the gate fingers within the second set of gate fingers extend from the second runner near a second side of the temperature sensor opposite the first side.

Embodiment 17. The electronic device of Embodiment 13, wherein each of the gate fingers within the first set of gate fingers is coupled to a conductive bridge spaced apart from the first runner.

Embodiment 18. A process of forming an electronic device including:
 forming a channel layer over a substrate;
 forming a drain electrode including drain fingers over the channel layer;
 forming a source electrode including source fingers over the channel layer, wherein the source fingers are spaced apart from the drain fingers; and
 forming a gate electrode including a runner, gate fingers and a conductive bridge, wherein:
  the runner includes a first portion and a second portion spaced apart from the first portion;
  the gate fingers are coupled to the runner and each gate finger is disposed between a pair of the source and drain fingers; and
  the first conductive bridge connects at least two gate fingers, wherein the first conductive bridge is along a conduction path between the first and second portions of the runner.

Embodiment 19. The process of Embodiment 18, further including:
 forming a transistor drain electrode including transistor drain fingers; and
 forming a transistor source electrode including transistor source fingers spaced apart from the transistor drain fingers; and
 forming a transistor gate electrode including a transistor runner, transistor gate fingers, wherein the transistor gate fingers extend from the transistor runner and a majority of transistors gate fingers are disposed between pairs of the transistor source and transistor drain fingers.

Embodiment 20. The process of Embodiment 19, wherein the channel layer includes a Group 13-N material; and the source fingers of the temperature sensor, the drain fingers of the temperature sensor, the gate fingers of the temperature sensor, the transistor source fingers, the transistor drain fingers, and the transistor gate fingers are coupled to the channel layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device including a temperature sensor, the temperature sensor comprising:
 a drain electrode including drain fingers;
 a source electrode including source fingers spaced apart from the drain fingers;
 a gate electrode including a runner, gate fingers, and a first conductive bridge, wherein:
  the runner includes a first portion and a second portion spaced apart from the first portion;
  the gate fingers are coupled to the runner and each gate finger is disposed between a pair of the source and drain fingers; and
  the first conductive bridge connects at least two gate fingers, wherein the first conductive bridge is along a conduction path between the first and second portions of the runner.

2. The electronic device of claim 1, further comprising a transistor adjacent to the temperature sensor, wherein the transistor includes:
 a transistor source electrode including transistor source fingers;
 a transistor drain electrode including transistor drain fingers spaced apart from the transistor source fingers; and
 a transistor gate electrode including transistor gate fingers, wherein the transistor gate fingers are disposed between the transistor source and transistor drain fingers.

3. The electronic device of claim 1, further comprising a channel layer underlying the gate fingers, wherein the channel layer comprises a Group 13-N material.

4. The electronic device of claim 3, wherein the temperature sensor further comprises a source terminal, a drain terminal, a gate pad, and a sensor pad, wherein:
 the source terminal is coupled to the source electrode;
 the drain terminal is coupled to the drain electrode;
 the gate fingers have proximal ends extending from the runner and distal ends opposite the proximal ends;
 the gate pad is coupled to the runner, wherein along the conduction path, the gate pad is closer to the first portion of the runner than to the second portion of the runner;

the sensor pad is coupled to the runner, wherein along the conduction path, the sensor pad is closer to the second portion of the runner than to the first portion of the runner; and the runner makes up at most 30% of a resistance between the gate and sensor pads.

5. The electronic device of claim 1, wherein the gate fingers have proximal ends extending from the runner and distal ends opposite the proximal ends.

6. The electronic device of claim 5, wherein the first conductive bridge is at the distal ends of the at least two gate fingers, wherein from a top view, a combination of the first conductive bridge and at least two gate fingers lie along three sides of a particular source finger of the source electrode.

7. The electronic device of claim 5, wherein the first conductive bridge is spaced apart from the distal ends and the proximal ends of the at least two gate fingers, wherein the first conductive bridge overlies a particular source finger of the source electrode.

8. The electronic device of claim 1, wherein the temperature sensor further comprises a gate pad and a sensor pad, wherein:

the gate pad is coupled to the runner, wherein along the conduction path, the gate pad is closer to the first portion of the runner than to the second portion of the runner; and the sensor pad is coupled to the runner, wherein along the conduction path, the sensor pad is closer to the second portion of the runner than to the first portion of the runner.

9. The electronic device of claim 8, wherein the runner makes up at most 30% of a resistance between the gate and sensor pads.

10. The electronic device of claim 8, further comprising a source terminal coupled to the source electrode, and a drain terminal coupled to the drain electrode.

11. The electronic device of claim 8, wherein the gate electrode further includes a second conductive bridge, wherein:

the runner includes a third portion, wherein the third portion of the runner is disposed between the first and second portions of the runner; and the second conductive bridge electrically connects at least two different gate fingers at a second bridge region spaced apart from the first, second and third portions of the runner, wherein the second conductive bridge is along the conduction path between the second and third portions of the runner.

12. The electronic device of claim 11, wherein along the conduction path, the sensor pad is closer to the second portion of the runner than to each of the first and third portions of the runner.

13. An electronic device including a temperature sensor, the temperature sensor comprising:

a source electrode including source fingers;

a drain electrode spaced apart from the source fingers;

a gate electrode including a first runner, a first set of gate fingers coupled to the first runner, a second runner, and a second set of gate fingers coupled to the second runner, wherein:

the first runner includes a first portion and a second portion spaced apart from the first portion; and a first conductive bridge electrically connects at least two gate fingers at a location spaced apart from the first and second portions of the first runner, such that the first conductive bridge is along a conduction path between the first and second portions of the first runner.

14. The electronic device of claim 13, further comprising a gate pad and a sensor pad coupled to the gate electrode, wherein the first runner lies along a conduction path between the gate and sensor pads, and the second runner does not lie along a conduction path between the gate and sensor pads.

15. The electronic device of claim 13, wherein the gate fingers within the second set of gate fingers are connected to each other only along the second runner.

16. The electronic device of claim 13, wherein each of the gate fingers within the first set of gate fingers is coupled to a conductive bridge spaced apart from the first runner.

17. The electronic device of claim 13, further comprising drain fingers coupled to the drain electrode.

18. The electronic device of claim 13, further comprising a channel layer underlying the gate fingers, wherein the channel layer comprises a Group 13-N material.

19. The electronic device of claim 13, wherein:

each of the gate fingers within the first and second set of gate fingers includes a proximal end and a distal end opposite the proximal end;

proximal ends of the gate fingers within the first set of gate fingers extend from the first runner near a first side of the temperature sensor; and proximal ends of the gate fingers within the second set of gate fingers extend from the second runner near a second side of the temperature sensor opposite the first side.

20. The electronic device of claim 19, wherein:

the distal ends of the gate fingers within the first set of gate fingers are closer to the second runner than to the first runner; and the distal ends of the gate fingers within the second set of gate fingers are closer to the first runner than to the second runner.

* * * * *